(12) United States Patent
Loeppert et al.

(10) Patent No.: US 8,791,531 B2
(45) Date of Patent: Jul. 29, 2014

(54) PACKAGE WITH A CMOS DIE POSITIONED UNDERNEATH A MEMS DIE

(75) Inventors: Peter V. Loeppert, Hoffman Estates, IL (US); David Giesecke, West Chicago, IL (US); Anthony Minervini, Palos Hills, IL (US); Jeffrey Niew, Burr Ridge, IL (US); Lawrence Grunert, Lombard, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 13/278,351

(22) Filed: Oct. 21, 2011

(65) Prior Publication Data

US 2012/0161259 A1    Jun. 28, 2012

Related U.S. Application Data

(63) Continuation of application No. 12/979,625, filed on Dec. 28, 2010, now abandoned.

(51) Int. Cl.
*H01L 29/82* (2006.01)
(52) U.S. Cl.
USPC ............ 257/415; 257/414; 257/416; 257/417

(58) Field of Classification Search
USPC ................... 257/414, 415, 416, 417
See application file for complete search history.

(56) References Cited

U.S. PATENT DOCUMENTS

| | | | |
|---|---|---|---|
| 6,846,690 B2 | 1/2005 | Farcy et al. | |
| 7,023,066 B2 * | 4/2006 | Lee et al. | 257/415 |
| 2006/0153418 A1 * | 7/2006 | Van Halteren | 381/396 |
| 2008/0123891 A1 | 5/2008 | Kato et al. | |
| 2009/0080682 A1 | 3/2009 | Ogura et al. | |
| 2010/0119097 A1 | 5/2010 | Ohtsuka et al. | |

FOREIGN PATENT DOCUMENTS

JP    2009-055198 A    3/2009

OTHER PUBLICATIONS

U.S. Appl. No. 12/979,625.*
International Search Report and Written Opinion for PCT/US2010/062226, dated Aug. 10, 2011.

* cited by examiner

*Primary Examiner* — Samuel Gebremariam
(74) *Attorney, Agent, or Firm* — Fitch, Even, Tabin & Flannery LLP

(57) ABSTRACT

A package is provided. The package has a substrate and a cover. A MEMS die is provided having a diaphragm. A CMOS die is provided wherein at least a portion of the CMOS die is positioned between the diaphragm and the substrate.

16 Claims, 9 Drawing Sheets

PACKAGE WITH A CMOS DIE POSITIONED UNDERNEATH A MEMS DIE

CROSS REFERENCE TO RELATED APPLICATION

This patent is a continuation of U.S. application Ser. No. 12/979,625, entitled "Package with A CMOS Die positioned Underneath a MEMS die," filed Dec. 28, 2010, the content of which is incorporated herein by reference in its entirety.

TECHNICAL FIELD

This invention relates to packages for MEMS transducers and particularly to MEMS packages with a reduced footprint.

BACKGROUND

It has been known in the art to build packages for containing micro-electromechanical systems ("MEMS") microphones. A typical package includes the MEMS transducer die, along with a separate complimentary metal-oxide-semiconductor ("CMOS") die for amplification of the signal arising from the MEMS transducer die. These die are mounted onto a substrate in a side-by-side formation within a package and wire bonded to each other and the substrate. For an example of this type of configuration, one can reference U.S. Pat. Nos. 6,781,231 and 7,242,089, the disclosures of which are incorporated herein by reference (including materials used to construct such types of packages, MEMS dies, and CMOS dies; dimension ranges for all parts/components; mechanical and/or electrical coupling methods; and any related manufacturing details). FIG. 1 also provides an example of this configuration. A package 101 comprises a substrate 102 and a cover 103. The package 101 has a MEMS transducer die 104 and a CMOS die 106 attached to the substrate 102. Because of the location of an acoustic port 108 above the transducer 104, a diaphragm 105 of the transducer 104 divides the package 101 into a back volume 107 and a front volume 109 (adjacent to the acoustic port 108). It is desirable to reduce the footprint of packages, such as those described above, to better fit into a variety of consumer electronic devices, such as cell phones, music players, computing devices, etc.

To this end, attempts have been made to stack the dies of a given package to reduce the footprint of the package. See, for example, the package 201 of FIG. 2. In this configuration, a CMOS die 206 is placed at least partially under a MEMS die 204 to reduce the footprint of the package. A major drawback with placement of the CMOS die 206 underneath the MEMS die 204 is that by doing so, either the height of the package is increased or if the MEMS die 204 is thinned, the back volume 207 of the package is decreased, thereby negatively impacting the microphone sensitivity and signal to noise ratio. It is at least one objective of the present invention to address this drawback.

BRIEF DESCRIPTION OF THE DRAWINGS

For a more complete understanding of the disclosure, reference should be made to the following detailed description and accompanying drawings wherein.

DETAILED DESCRIPTION OF THE INVENTION

Figure 1:
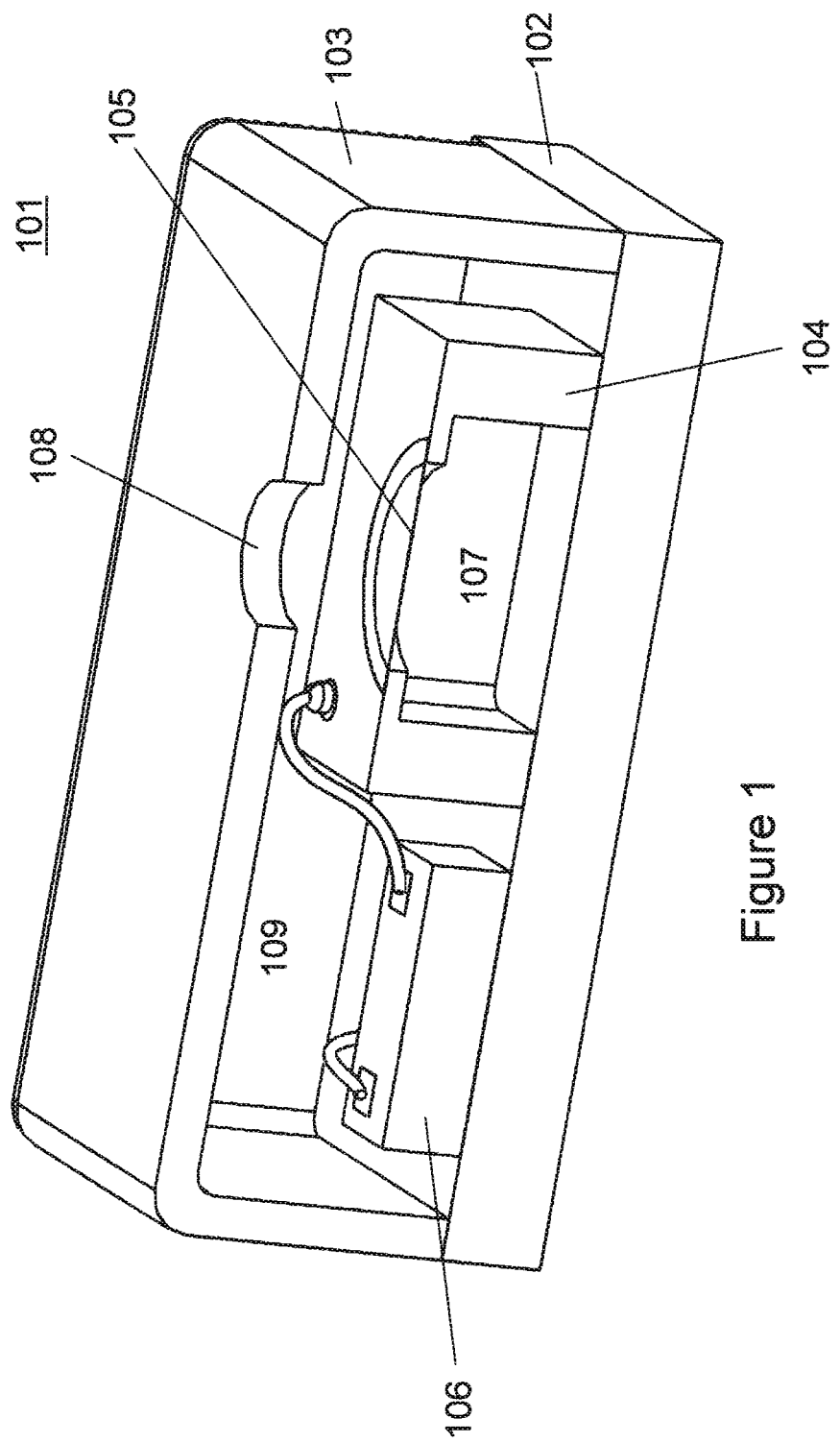
FIG. 1 is a cross-sectional view of a prior art package containing a separate CMOS and MEMS die in a side by side configuration.
Figure 2:
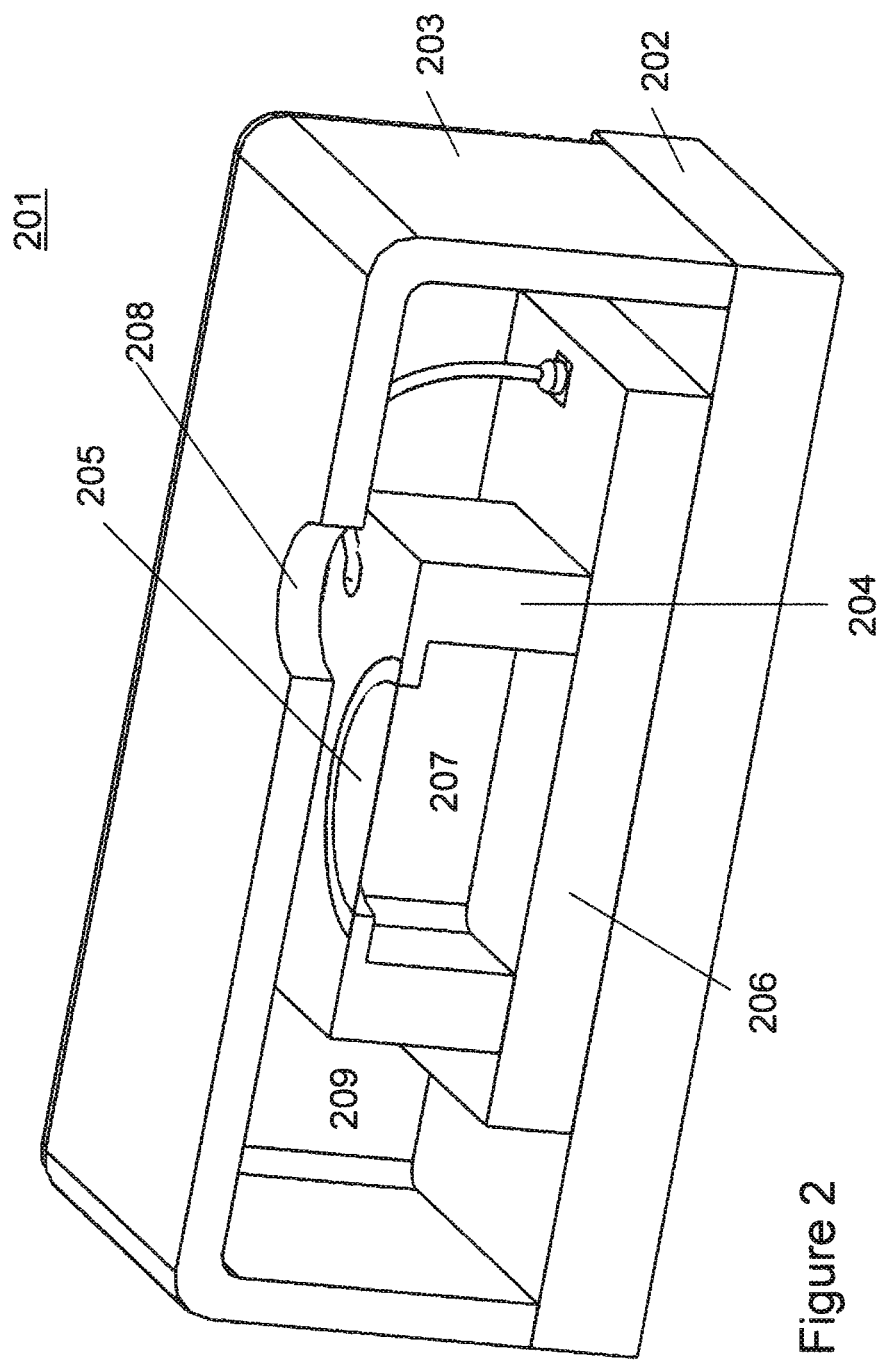
FIG. 2 is a cross-sectional view of a prior art package comprising separate CMOS and MEMS die in a stacked configuration.

While the invention of the present disclosure is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention defined by the appended claims. Moreover, it is understood that like numerals will refer to like parts.

As mentioned above, the diaphragm of a MEMS microphone effectively divides the package into two acoustic volumes, denoted the front volume and the back volume. The front volume is the portion of the package which is adjacent to the acoustic port while the back volume is that portion of the package which is on the side of the diaphragm opposite to where the acoustic port is located. The size of the back volume is a key acoustic parameter and contributes to the microphone sensitivity and signal to noise ratio. Maximization of the back volume can lead to maximization of the acoustic performance of the microphone.

In an embodiment, a package is provided. The package has a substrate and a cover. A MEMS die is located on the substrate. A CMOS die is located underneath the MEMS die. The CMOS die has a volume. An acoustic port is located in the package, wherein the package has a back volume located between the MEMS die and the substrate. An effective back volume exists which is equal to the back volume minus the volume of the CMOS die.

In an embodiment, the acoustic port is in the cover.
In an embodiment, the acoustic port is in the substrate.

In an embodiment, the package has a channel created within the MEMS die wherein the CMOS die is partially nested underneath the MEMS die.

In another embodiment, a package is provided. The package has a substrate and a cover. A MEMS die is located on the substrate. A CMOS die is located underneath the MEMS die. The CMOS die has a volume. An acoustic port is provided in the package, wherein the package has a front volume located between the MEMS die and the substrate. An effective front volume exists which is equal to the front volume minus the volume of the CMOS die.

In an embodiment, the acoustic port is located in the substrate.

In an embodiment, the acoustic port is positioned adjacent to the CMOS die.

In another embodiment, a package is provided. The package has a substrate and a cover. A MEMS die is provided which has sidewalls and a diaphragm connected to the sidewalls. A CMOS die is positioned on the substrate, underneath the MEMS die and surrounded by the sidewalls of the MEMS die.

In an embodiment, the package has an acoustic port within the cover.

In an embodiment, the package has an acoustic port within the substrate.

In another embodiment, a package is provided. The package has a substrate and a cover. A MEMS die is provided having sidewalls and a diaphragm connected to the sidewalls.

A CMOS die is positioned on the substrate, partially underneath the MEMS die and through a channel in a sidewall of the MEMS die.

In an embodiment, the package has a sealant enclosing a portion of the CMOS die which is positioned exterior to the MEMS die.

In an embodiment, the package has an acoustic port within the substrate.

In an embodiment, the package has an acoustic port within the cover.

In another embodiment, a package is provided. The package has a substrate and a cover. A MEMS die is provided having a diaphragm. A CMOS die is provided wherein at least a portion of the CMOS die is positioned between the diaphragm and the substrate.

In an embodiment, the CMOS die is contained within sidewalls of the MEMS die.

In an embodiment, the CMOS die extends through a channel in the MEMS die.

In an embodiment, the package has a sealant enclosing a portion of the CMOS die which extends exterior to the MEMS die.

In an embodiment, the package has an acoustic port within the substrate.

In an embodiment, the package has an acoustic port within the cover.

Figure 3:
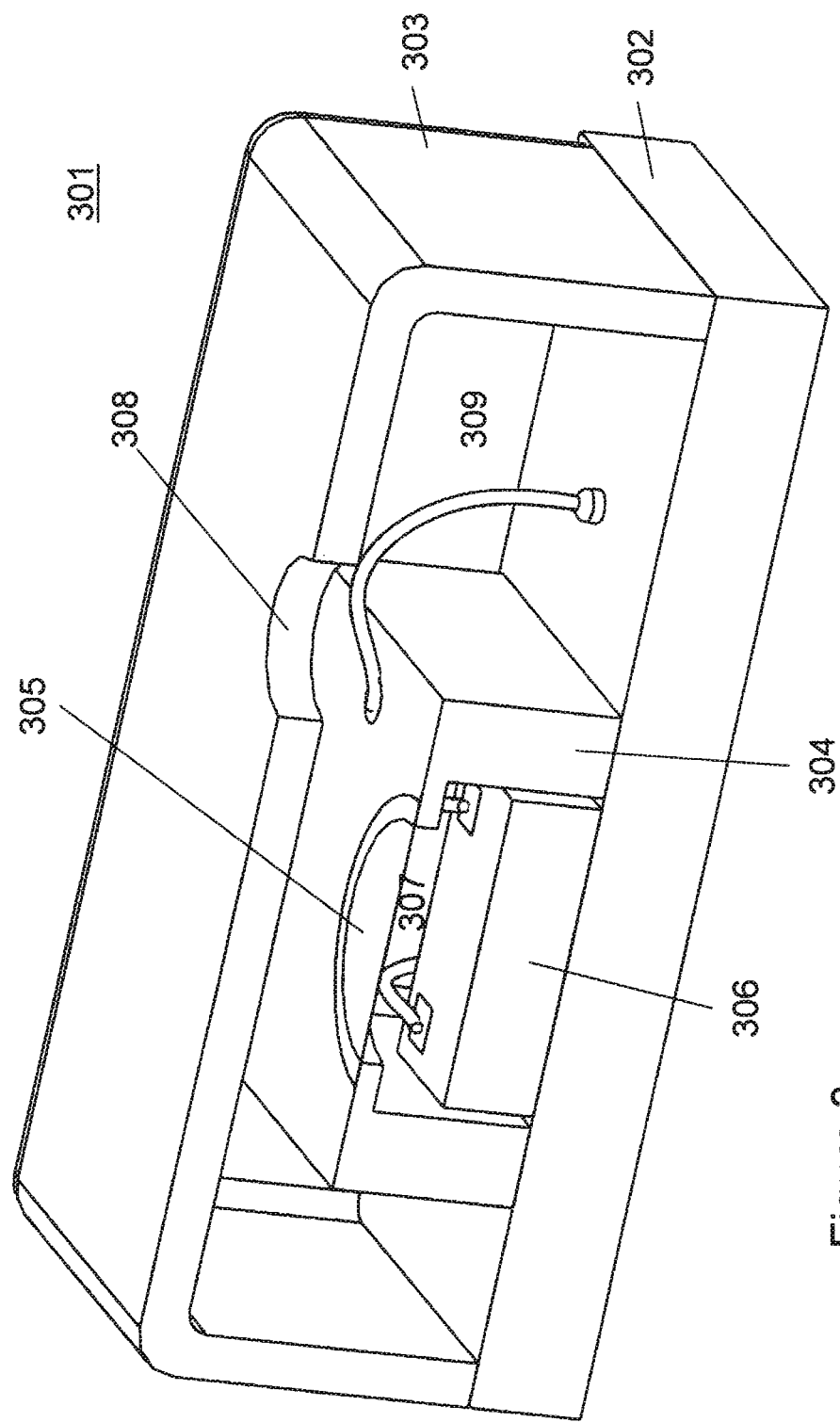
FIG. 3 is a cross-sectional view of a package having a CMOS die located underneath a MEMS die in an embodiment of the present invention.

The present invention seeks to counter the teachings against placing the CMOS die underneath the MEMS die and thereby reducing the volume underneath the MEMS die. In a first embodiment of the present invention, illustrated in FIG. 3, a package 301 contains a CMOS die 306 underneath a MEMS transducer die 304. An acoustic port 308 is above the MEMS die 304; therefore, the package 301 has a front volume 309 and a back volume 307 on a side of a diaphragm 305 opposite to the acoustic port 308. In order to reduce the footprint of the package 301, it is possible to increase the dimensions of the MEMS die 304 to accommodate the placement of the CMOS die 306 underneath the MEMS die 304 and within the back chamber or back volume 307 of the MEMS die 304. The increased back chamber volume 307, less the volume of the CMOS die 306, will provide an overall back volume that will exceed the back volume of the conventional implementation that is known in the art, i.e., that of FIG. 1. Increasing the dimensions of the MEMS die 304 may increase the overall cost of manufacture of the MEMS die 304. However, the increased cost is compensated by the overall reduced size and/or cost of the package. Thus, a package having a reduced footprint is achieved with the same or better performance acoustically, while demonstrating a cost comparable to that of a conventional package known in the art.

The following is an embodiment of the present invention in which, for example, the package 301 is configured to provide an acoustic performance similar to the package 101. Assuming the MEMS die 104 in FIG. 1 has dimensions 1.1 mm×1.1 mm×0.4 mm, with a back chamber having dimensions that are 0.74 mm×0.74 mm×0.4 mm, the back chamber volume (otherwise understood as the volume underneath the diaphragm 305) is 0.22 mm^3. The CMOS die 106 has dimensions of 0.5 mm×0.5 mm×0.2 mm for a volume of 0.05 mm^3. To achieve the same level of performance in the embodiment in FIG. 3 as that in FIG. 1, the dimensions of the MEMS die 304 must increase to 1.2 mm×1.2 mm×0.4 mm, to provide a back chamber having dimensions of 0.84 mm×0.84 mm×0.4 mm. This provides a back chamber volume of 0.28 mm^3. When the CMOS die 306 is placed underneath and within the back chamber of the MEMS die 304, the effective back volume (or volume of back chamber minus the volume of the CMOS die 306) becomes 0.23 mm^3 which is slightly larger than that of the back volume 107 of the package 101 of FIG. 1. Thus, a slightly better performance can be achieved by nesting the CMOS die under the larger-sized MEMS die. The larger MEMS die may be, for example, 20% more expensive to manufacture; however, the package size (and therefore, cost) can be reduced to compensate for the increased cost of the MEMS.

Figure 4:
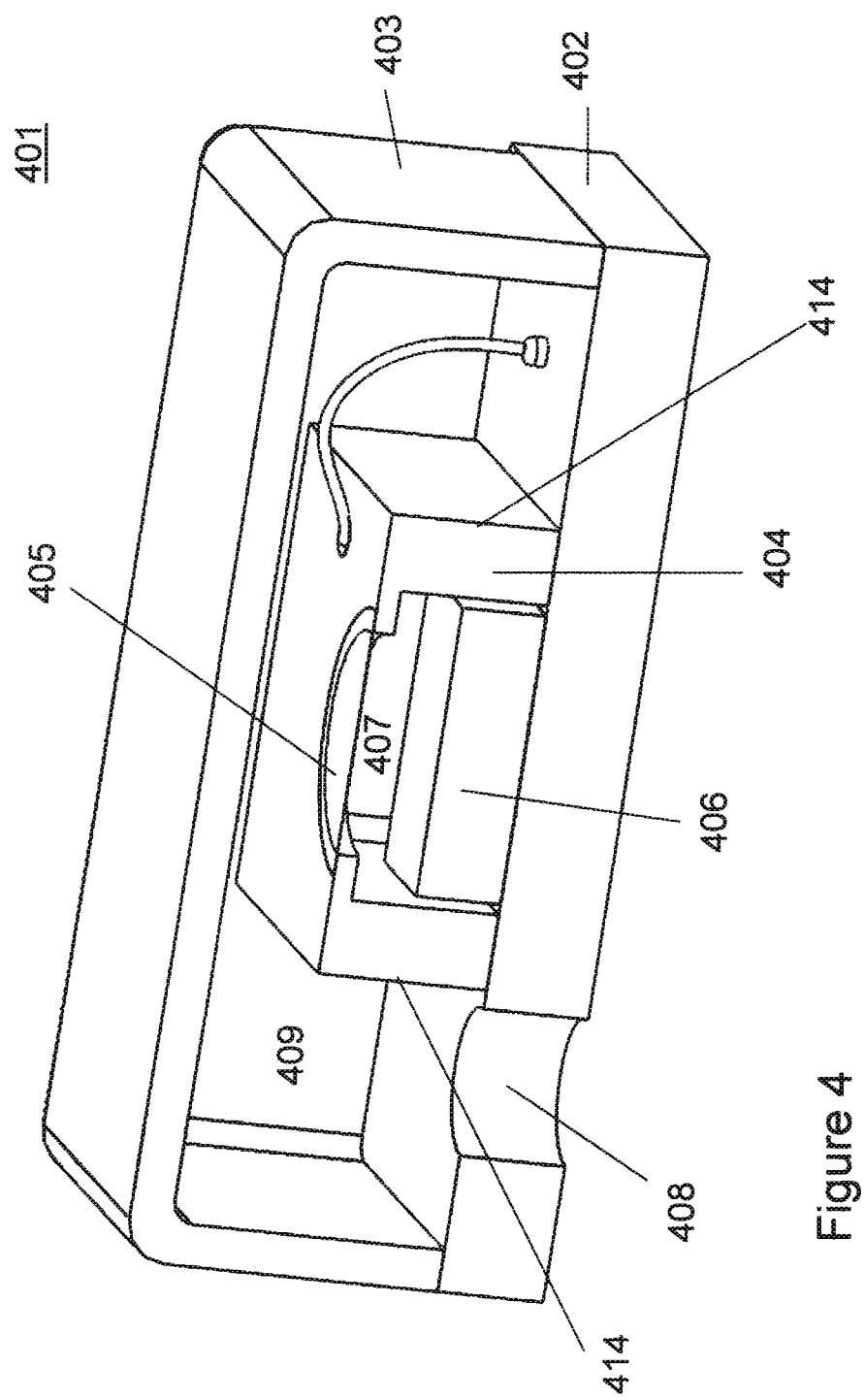
FIG. 4 is a cross-sectional view of a further embodiment of the present invention in which a package has a CMOS die located under a MEMS die, wherein the CMOS die is flip chip mounted, and the MEMS die is wire bonded, and wherein the acoustic port is located in a substrate.

Referring now to FIG. 4, an embodiment is shown in which a package 401 (having substrate 402 and cover 403) contains a MEMS die 404 and a CMOS die 406 located underneath the MEMS die 404. The entire CMOS die 406 is located between sidewalls 414 of the MEMS die 404. The CMOS die 406 is shown as flip chip bonded while the MEMS die 404 is wire bonded. It should be understood, however, that any type of coupling known to those skilled in the art is contemplated. The MEMS die 404 may have dimensions such that an overall or effective back volume 407 of the package 401 (i.e., volume underneath the diaphragm minus the volume of the CMOS die 406) is sufficient to produce an acoustic performance demonstrated by conventional transducer packages. In this embodiment, an acoustic port 408 is provided in the substrate 402 and is adjacent to the MEMS die 404.

Figure 5:
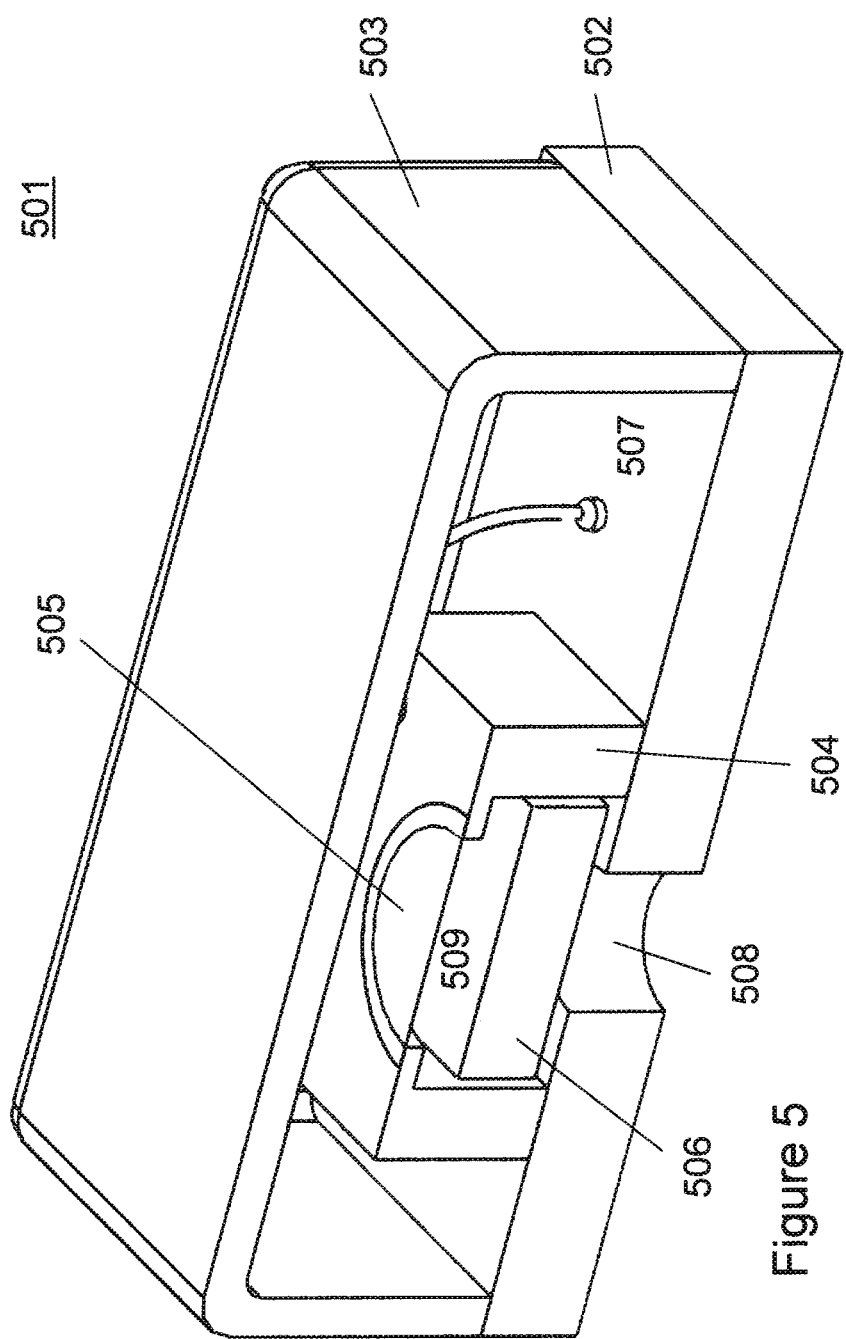
FIG. 5 is a cross-sectional view of a further embodiment of a package of the present invention in which a package has a CMOS die located under a MEMS die, and wherein the acoustic port is located in a substrate underneath the MEMS die.

FIG. 5 illustrates a package 501 in another embodiment of the present invention. A CMOS die 506 is located underneath a MEMS transducer die 504. An acoustic port 508 is located under the CMOS die 506 in substrate 502. Because the acoustic port 508 is located underneath the MEMS die 504, the back volume 507 is defined as that portion of the package 501 that is between the cover 503 and the MEMS die 504. The front volume 509 is that portion under the MEMS die 504, less the volume of the CMOS die 506. In this case, the back volume 507 is increased by having the CMOS die 506 in the front volume 509. Accordingly, the package 501 may demonstrate sensitivity and signal-to-noise characteristics as seen in conventional packages while providing a smaller overall footprint.

Figure 6:
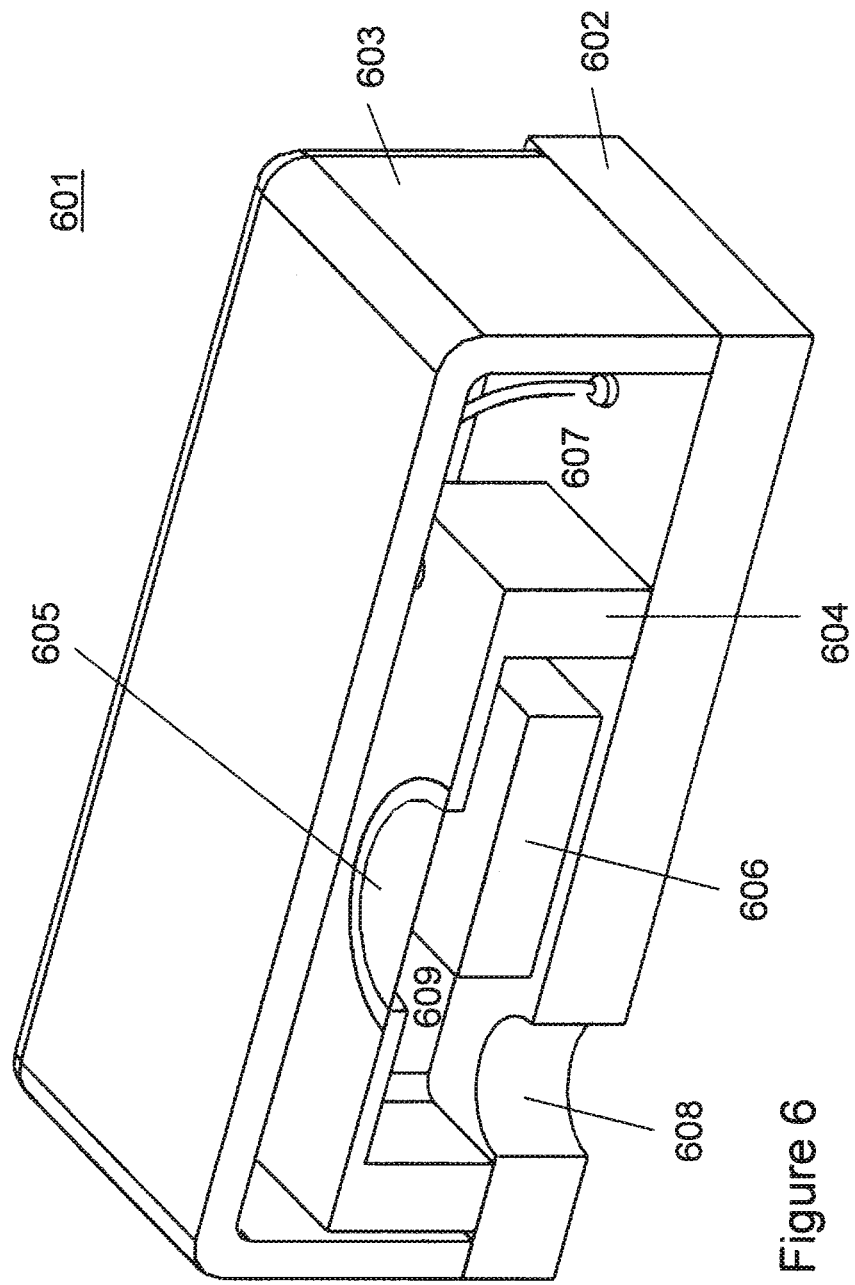
FIG. 6 is a cross-sectional view of a further embodiment of a package of the present invention in which a package has a CMOS die located under a MEMS die, wherein the acoustic port is located in a substrate but offset from the CMOS die.

FIG. 6 illustrates an embodiment similar to that of FIG. 5; however, in this embodiment, the acoustic port 608 is adjacent to the CMOS die 606, rather than under it. However, both the CMOS die 606 and the acoustic port 608 are under the MEMS die 604. In this embodiment, the front volume 609 is defined as the volume between the acoustic port 608 and the diaphragm 605. It is contemplated that, in this embodiment, the MEMS die 604 may have dimensions, at least in length and/or width, which are greater than the MEMS die 304, 404, 504 previously described. It is also contemplated that, in an embodiment, the MEMS die 604 is sized to partially cover the acoustic port 608. Moreover, it is further contemplated that, in an embodiment, the acoustic port 608 is located in the substrate 602 but only partially underneath the CMOS die 606.

Figure 7:
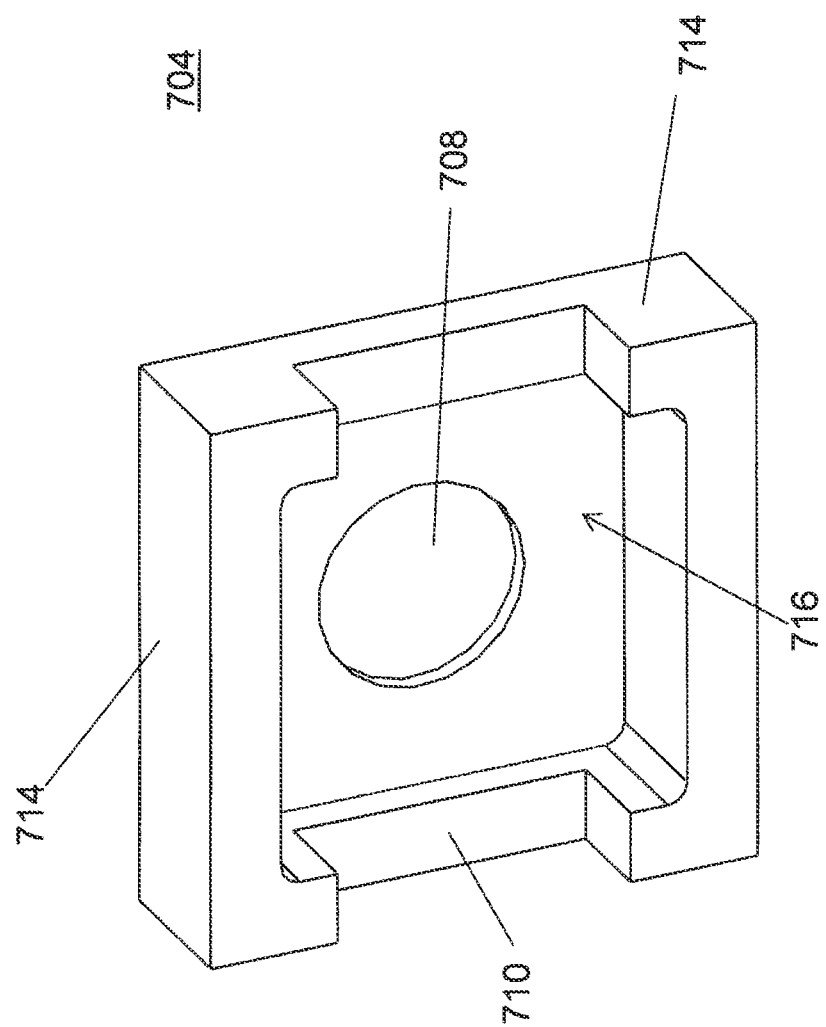
FIG. 7 is a bottom perspective view of a MEMS die in an embodiment of the present invention, whereby the MEMS die contains a partial cut through the sidewalls of a back chamber.

Referring now to FIG. 7, a MEMS die 704 is illustrated which has been modified by etching or cutting a channel 710 partially through the sidewalls 714 of the back chamber 716. The preferred method to achieve this channel 710 is by partially dicing with a dicing saw; however, other methods are available as contemplated by those of skill in the art. The MEMS die 704 of this embodiment may be utilized in packages 801 and 901 described below. The channel 710 is rectangular in shape; however, other shapes may be used as necessary for a given application.

Figure 8:
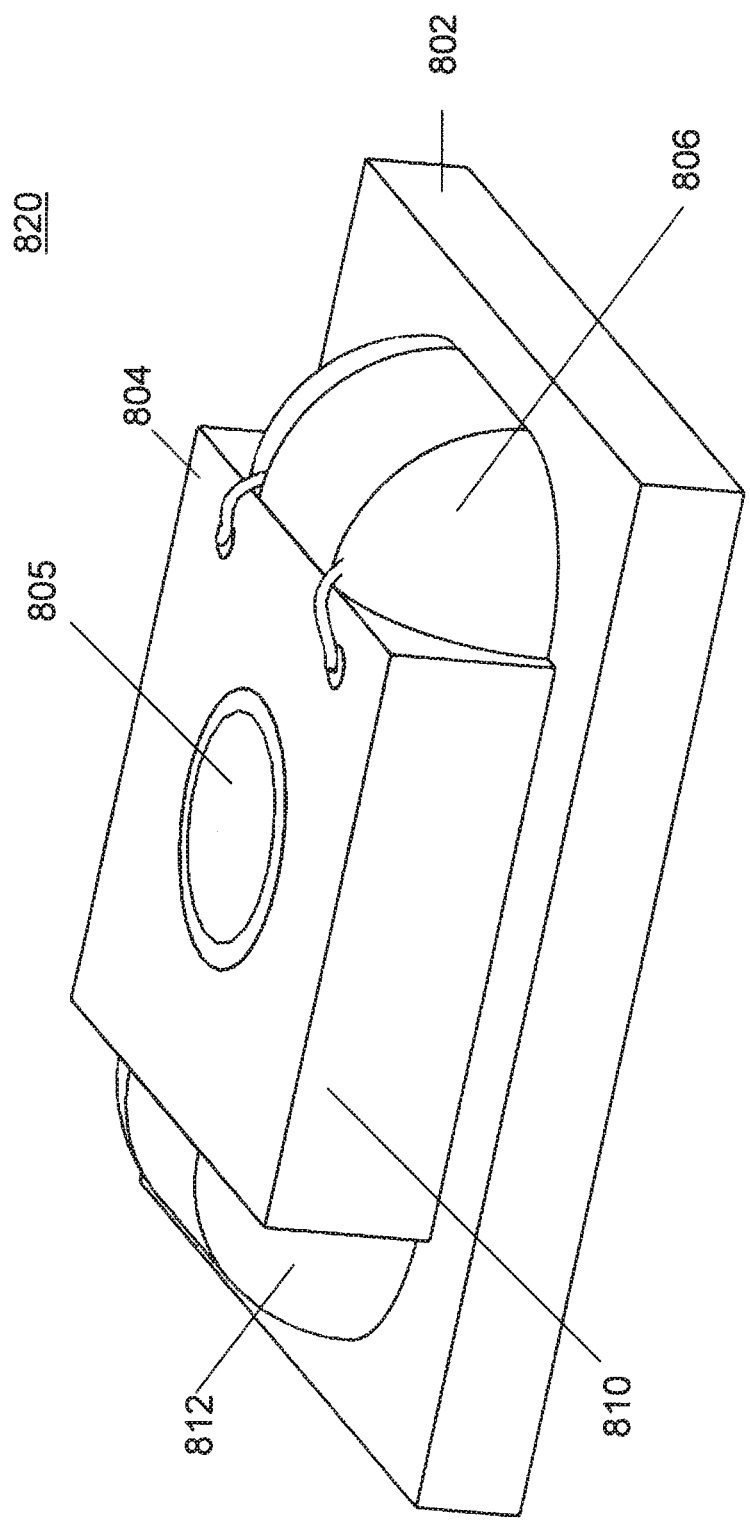
FIG. 8 is a perspective view of an embodiment of the present invention in which a CMOS die is partially nested under a MEMS die containing a partial cut through the sidewalls of the back chamber.
Figure 9:
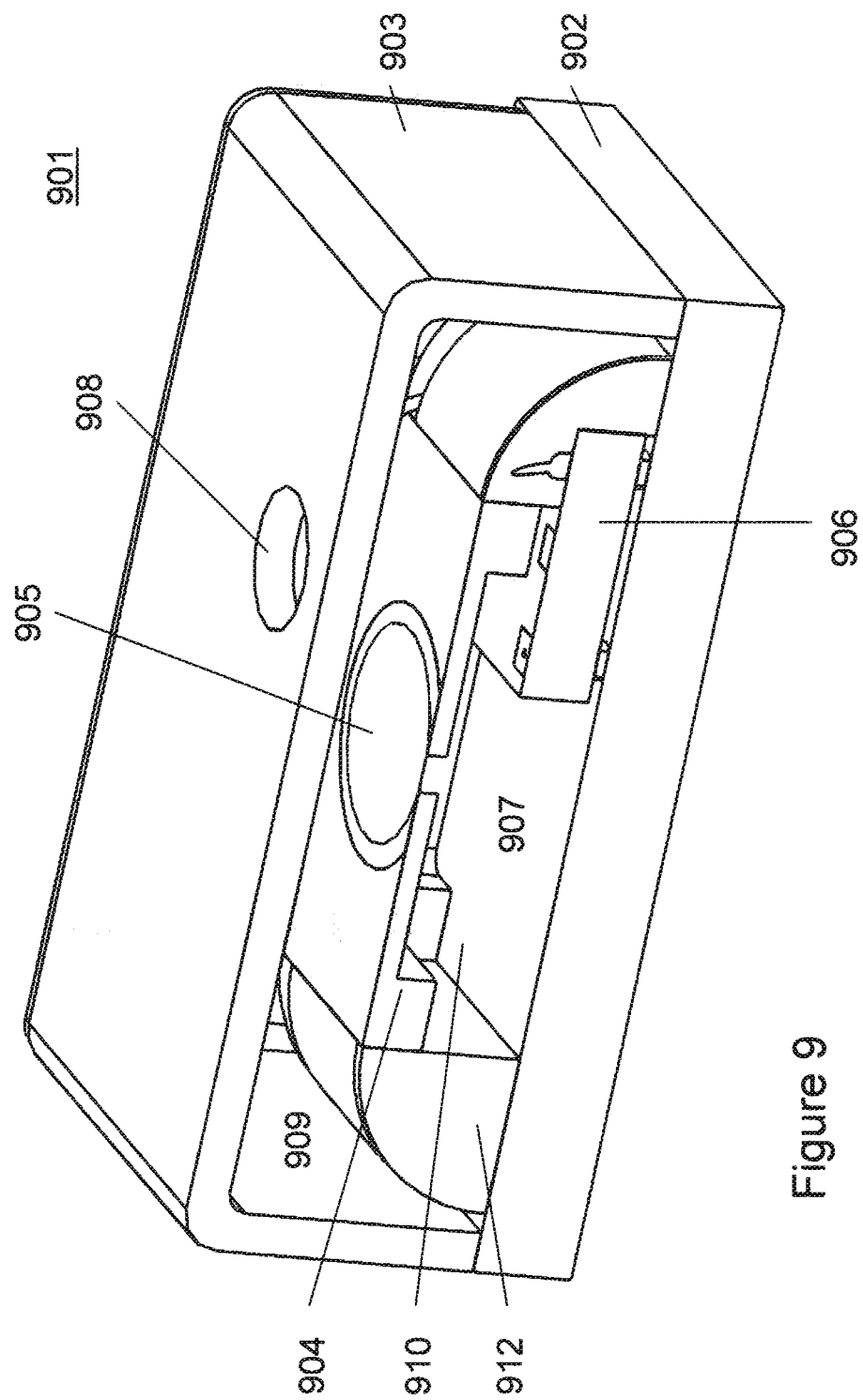
FIG. 9 is a cross-sectional view of a package in an embodiment of the present invention in which a CMOS die is partially nested under a MEMS die with a partial cut through the sidewalls of the back chamber and wherein the MEMS die has channels associated therewith.

FIG. 8 shows an isolated view of a MEMS die 804 with a channel 810 similar to that demonstrated by the MEMS die 704, wherein the die 804 is mounted to a substrate 802. A CMOS die 806 (shown in dotted line) is also mounted to the substrate 802 and is partially nested under the MEMS die 806. A portion of the CMOS die 806 protrudes through the channel 810 in the MEMS die 804. The CMOS die 806 may be connected to the substrate 802 by a variety of well known methods, including but not limited to, wire bonding, flip-chip bonding, and through-silicon vias. A sealant material 812, such as silicone, is applied to the sides of the MEMS die 804 to seal the channels 810 on both sides of the die and cover the CMOS die 806. This isolates the volume under the MEMS die 804 from the outside. FIG. 9 shows an embodiment of a package 901 that includes a CMOS die 906 partially nested under a MEMS die 904 having a channel 910 to accommodate the CMOS die 906, i.e., similar to the embodiment of FIG. 8. A sealant material 912 is applied to either side of the MEMS die 904 over the channel 910 to isolate the back volume 907 from the front volume 909. An acoustic port 908 through the cover 903 completes the assembly. In an embodiment, an acoustic port (not shown in the figure but contemplated based on previously described embodiments) may be located in the substrate 902 of the package 901. The port may be located underneath or adjacent to the MEMS die 904. These embodiments may provide desired sensitivity and signal-to-noise characteristics while still providing a reduced overall footprint to the package 901.

Preferred embodiments of this invention are described herein, including the best mode known to the inventors for carrying out the invention. It should be understood that the illustrated embodiments are exemplary only, and should not be taken as limiting the scope of the invention.

We claim:

1. A package comprising:
   a substrate;
   a cover;
   a MEMS die, the MEMS die having a top surface and a bottom surface, the bottom surface being in direct physical contact with the substrate;
   a CMOS die located underneath the MEMS die, the CMOS die having a volume;
   an acoustic port in the package, wherein the package has a back volume located between the MEMS die and the substrate and wherein an entirety of the CMOS die directly communicates with and is disposed within the back volume, wherein the back volume does not directly communicate with the acoustic port;
   wherein an effective back volume exists which is equal to the back volume minus the volume of the CMOS die.

2. The package of claim 1 wherein the acoustic port is in the cover.

3. The package of claim 1 wherein the acoustic port is in the substrate.

4. A package comprising:
   a substrate;
   a cover;
   a MEMS die, the MEMS die having a top surface and a bottom surface, the bottom surface being in direct physical contact with the substrate;
   a CMOS die located underneath the MEMS die and being in direct physical contact with the substrate, the CMOS die having a volume;
   an acoustic port disposed through the substrate and underneath the MEMS die;
   wherein the package has a front volume located between the MEMS die and the substrate and wherein an entirety of the CMOS die directly communicates with and is disposed within the front volume, and wherein the front volume communicates directly with the acoustic port;
   wherein an effective front volume exists which is equal to the front volume minus the volume of the CMOS die.

5. A package comprising:
   a substrate;
   a cover;
   a MEMS die having sidewalls and a diaphragm connected to the sidewalls, the MEMS die having a top surface and a bottom surface, the bottom surface being in direct physical contact with the substrate, the top surface including the diaphragm;
   a back volume that is formed between the sidewalls;
   a front volume that is formed outside the sidewalls;
   a CMOS die positioned on the substrate, underneath the MEMS die and surrounded by the sidewalls of the MEMS die and wherein an entirety of the CMOS die directly communicates with and is disposed within the back volume.

6. The package of claim 5 further comprising:
   an acoustic port within the cover.

7. The package of claim 5 further comprising:
   an acoustic port within the substrate.

8. A package comprising:
   a substrate;
   a cover;
   a MEMS die having sidewalls and a diaphragm connected to the sidewalls, the MEMS die having a top surface and a bottom surface, the bottom surface being in direct physical contact with the substrate;
   a back volume that is formed between the sidewalls;
   a front volume that is formed outside the sidewalls and separate from the back volume, and the front volume communicating with a port;
   a CMOS die positioned on the substrate, partially underneath the MEMS die within the back volume and through a channel in a sidewall of the MEMS die.

9. The package of claim 8 wherein the channel is acoustically sealed to effectively separate the back volume and the front volume.

10. The package of claim 8 further comprising:
    an acoustic port within the substrate.

11. The package of claim 8 further comprising:
    an acoustic port within the cover.

12. A package comprising:
a substrate;
a cover;
a MEMS die having a diaphragm, the MEMS die having a top surface and a bottom surface, the bottom surface being in direct physical contact with the substrate;
a CMOS die wherein the CMOS die is positioned between the diaphragm and the substrate and wherein an entirety of the CMOS die directly communicates with and is disposed within the back volume.

13. The package of claim 12 wherein the CMOS die is contained within sidewalls of the MEMS die.

14. The package of claim 12 further comprising:
an acoustic port within the substrate.

15. The package of claim 12 further comprising:
an acoustic port within the cover.

16. A package comprising:
a substrate;
a cover;
a MEMS die, the MEMS die having a top surface and a bottom surface, the MEMS die located on the substrate;
a CMOS die located underneath the MEMS die on the substrate, the CMOS die having a volume, wherein the bottom surface of the MEMS die is not in contact with the CMOS die;
an acoustic port in the package, wherein the package has a back volume located between the MEMS die and the substrate and wherein an entirety of the CMOS die directly communicates with and is disposed within the back volume, and wherein the back volume is not in direct communication with the acoustic port;
wherein an effective back volume exists which is equal to the back volume minus the volume of the CMOS die.

* * * * *